United States Patent [19]

Stut

[11] Patent Number: 4,504,801
[45] Date of Patent: Mar. 12, 1985

[54] MICROWAVE POWER GENERATOR WITH DUAL COAXIAL LINES CONNECTED TO TRANSISTOR

[75] Inventor: Hans Stut, Tokyo, Japan

[73] Assignee: Fuji Electronic Components Ltd., Tokyo, Japan

[21] Appl. No.: 410,858

[22] Filed: Aug. 23, 1982

[30] Foreign Application Priority Data

Aug. 21, 1981 [JP] Japan ................................ 56-130217

[51] Int. Cl.³ ............................................ H03B 5/00
[52] U.S. Cl. .................................. 331/117 D; 331/99; 331/101; 331/177 R
[58] Field of Search .......... 331/96, 99, 117 D, 177 R, 331/101

[56] References Cited

U.S. PATENT DOCUMENTS 3,315,180 4/1967 Racy .................................. 331/101

Primary Examiner—Eugene R. LaRoche
Assistant Examiner—Robert J. Pascal
Attorney, Agent, or Firm—Spencer & Frank

[57] ABSTRACT

A small size and light weight microwave power generating apparatus in which a power MOS FET which can withstand a high voltage and large current is combined with a microwave transmission circuit having a drain side coaxial resonating system having an internal conductor connected to the drain of the MOS FET to be tuned under a cavity parallel resonating condition to an oscillating frequency and a gate side coaxial resonating system having an internal conductor connected to the gate electrode of the MOS FET and an external conductor connected to the internal conductor of the gate side coaxial resonating system via a variable capacitor. A high frequency oscillation (100–1000 MHz) is realized without the use of a magnetron by the internal capacitances $C_{GS}$ and $C_{DS}$ of the MOS FET.

20 Claims, 9 Drawing Figures

MICROWAVE POWER GENERATOR WITH DUAL COAXIAL LINES CONNECTED TO TRANSISTOR

BACKGROUND OF THE INVENTION

The present invention relates to a microwave power generating apparatus with a power field effect transistor.

Microwave apparatuses such as radars, microwave communication systems and induction heating unit appliances such as electronic ovens, require a microwave generator and its associative amplifiers. A magnetron has mostly been used as an active element for the microwave generator. The magnetron, however, has many problems to be solved. For example, a high voltage power source is required. The magnetron is large in size, heavy in weight and high in cost. Its life-time is unsatisfactory. A high voltage pulse power source is required for the output control. It is difficult to control the magnetron and the oscillating frequency of the magnetron cannot be varied.

SUMMARY OF THE INVENTION

Accordingly, an object of the present invention is to provide a microwave power generating apparatus in which a power field effect transistor, which can withstand a high voltage and a large current, and a microwve transmission circuit are combined without the use of a magnetron in such a manner that the abovementioned disadvantages are successfully removed.

In order to achieve the above object, a microwave power generating apparatus is provided according to the present invention which comprises a power MOS field effect transistor, a drain side coaxial resonating system having an internal conductor connected to the drain electrode of the transistor and tuned under a parallel cavity resonating condition to the oscillation frequency and a gate side coaxial resonating system having an internal conductor connected to the gate electrode of the transistor and an external conductor which is terminated at the internal conductor of the gate side coaxial resonating system via a variable capacitor in a manner such that the gate side coaxial resonating system is tuned under a series cavity resonating condition to the oscillating frequency. The outer conductors of the drain and gate side coaxial resonating systems each have one end connected to a common potential point. A DC power source voltage is applied between the common potential point and the source electrode of the transistor, and an oscillation control voltage signal is applied to the gate electrode. The microwave power generating apparatus oscillates with a positive feedback ratio substantially determined by the ratio of the drain-source capacitance to the gate-source capacitance of the transistor, so that the power output of the microwave power generating apparatus is derived from the internal conductor of the drain $\frac{1}{4}$ or $\frac{3}{4}$ of the wave length of the microwave signal and closed at one end thereof.

In a preferred embodiment of the present invention, the gate-source capacitance of the MOS field effect transistor may be formed with such a structure that a silicon oxide film acting as the dielectric medium is interposed between a matrix gate common to a number of transistor units integrated in a single chip forming the transistor and a metal film as the source electrode is deposited on the silicon oxide film covering the gate.

In another preferred embodiment according to the present invention, a measuring loop functioning as a detecting terminal for control of the microwave power generating apparatus may be coupled to the drain or gate side coaxial resonating system, so that the measuring loop is directly interlinked to a resonating cavity of the drain or gate side coaxial resonating system. The variable capacitor of the gate side coaxial resonating system may be a variable capacitor in the form a voltage dependent capacitive element, so that the oscillating frequency is controlled by controlling the voltage applied to the voltage dependent capacitive element in response to a detected signal from the measuring loop as an actual value signal.

In yet another preferred embodiment, the variable capacitor of the gate side coaxial resonating system may be a trimmer capacitor and the oscillating frequency is controllable by adjusting the trimmer capacitor.

Further, in the present invention, it is preferable that the oscillation output is controlled by pulse-width-modulating the oscillating control voltage signal applied to the gate electrode. The oscillating control voltage signal applied to the gate electrode may be pulse-width-modulated by the detected signal from the measuring loop as an actual signal so that the oscillation output is controlled to a predetermined value.

The MOS field effect transistor chip may be thermally closely mounted to a plate-like conductive substrate, to which one end of the internal conductor in the form of a solid cylinder of the drain side coaxial resonating system is thermally closely coupled, and a cooling heat sink is mounted to the other end of the internal conductor. Alternatively, the field effect transistor chip may thermally closely be mounted to the conductive substrate, to which one end of the internal conductor of the drain side coaxial resonating system formed as a heat pipe in the form of a hollow cylinder is thermally closely coupled, and a cooling heat sink is mounted to the other end of the internal conductor.

In a further preferred embodiment of the present invention, the MOS field effect transistor chip is formed as a vertical MOS type chip in which the drain electrode is formed on one of the surfaces of the chip and the source electrode and the gate electrode are disposed on the other surface, the one surface of the chip is mounted on and electrically connected to the conductive substrate, a ceramic ring is disposed around the thus mounted chip, one end surface of the ceramic ring is hermetically mounted to the conductive substrate, an opening of the other end face of the ceramic ring is hermetically closed by a gate conductive plate, so that the conductive substrate, the ceramic ring and the gate conductive plate form a sealing case for accommodating the chip, the gate electrode of the chip is connected to the gate conductive plate, and a source electrode pin in the form of a sealing terminal passing through the sealing case is derived from the source electrode.

Here, the gate electrode of the MOS field effect transistor chip is disposed on the peripheral portion of the other surface of the chip, the gate electrode is connected to conductive gate electrode layers on a gate port made of insulating material and mounted to the conductive substrate by means of a plurality of bonding wires, and the conductive gate electrode layers are further connected to the gate conductive plate through conductive pins planted on the conductive gate electrode layers.

Alternatively, the drain and gate side coaxial resonating systems are electrically and mechanically connected at respective ends of the external conductors thereof and form a closed case with respect to microwave energy, and the internal conductors of both the coaxial resonating systems are accommodaed in the closed case, together with the MOS field effect transistor of which the drain and gate electrodes are connected to respective ends of the internal conductors.

In yet another prefered embodiment, a source resistor is connected in series to a power feeding line connected to the source electrode to stabilize the current flowing through the power feed line. A resistor for discharging charges from the gate electrode may be connected between a power feeding line connected to the gate electrode and the power feeding line connected to the source electrode.

Additionally, filters for microwave energy may be provided for the power feeding lines to the gate and source electrodes in such a manner that the potentials at the filters are set at the same potential as that at a common potential point connecting one end of each of the drain and gate coaxial resonating systems to each other and the filters are disposed in a power feeding case closed with respect to microwave energy. The filter may include feed inductances inserted into the power feeding lines connected to the gate and source electrodes and a capacitance associated with feed-throughs via which the power feeding lines pass through the power feeding case.

In a further preferred embodiment, the diameter of the drain side coaxial resonating system is larger than that of the gate side coaxial resonating system, the one ends of both coaxial resonating systems are connected and closedly coupled to each other by means of a tubular frame mounted to the external conductor of the drain side coaxial resonating system and a ring-like cover plate for coupling an end face of the frame to the external conductor of the gate side coaxial resonating system, and an oscillating output is derived from the internal conductor of the drain side coaxial resonating system through a through-hole of the frame by an antenna bar.

The frame may be removably coupled to the cover plate and the gate side coaxial resonating system may be separated from the drain side coaxial resonating system by breaking the coupling of the frame with the cover plate. The frame may be mounted through an insulating member to a grounded case of an object to which the oscillating output is to be supplied.

DETAILED DESCRIPTION OF THE PREFERRED EMBODIMENTS

The present invention will be described in detail with reference to the accompanying drawings.

Figure 1:
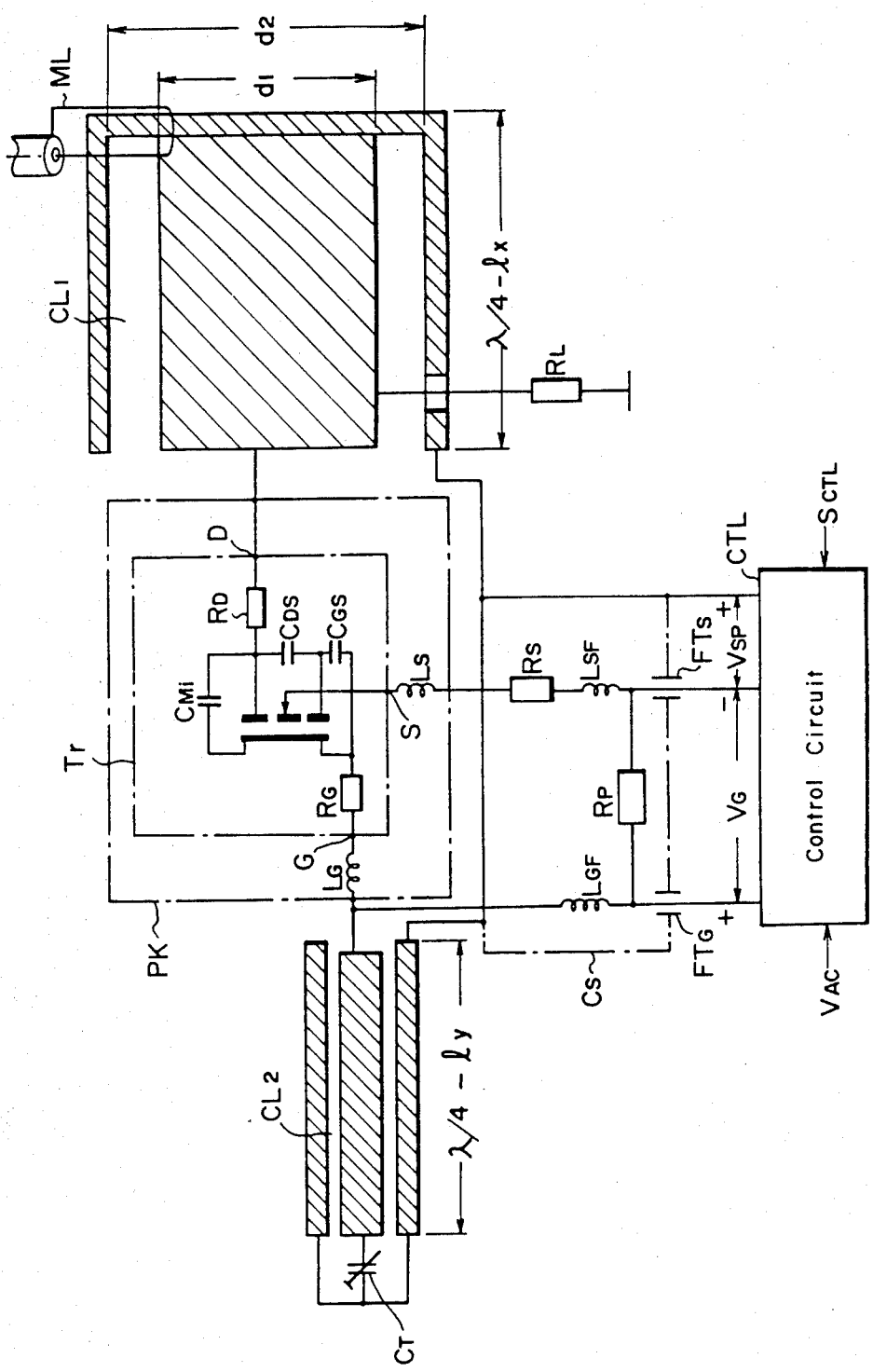
FIG. 1 is a circuit diagram showing the fundamental circuit arrangement of a microwave power generating apparatus according to the present invention.

A fundamental arrangement of a microwave power generating apparatus according to the present invention is shown in FIG. 1. In FIG. 1, Tr is a field effect power transistor chip having a high withstand voltage and a large current capacity, for example, a SIMPOS power transistor (trade name, manufactured by Siemens), and its equivalent circuit is illustrated in a dashed line block. PK designates a package for accommodating the transistor chip Tr and extracting lead wires from electrodes of the transistor chip Tr. In the transistor chip Tr, G designates a gate electrode, S a source electrode, D a drain electrode, $R_G$ a gate resistor, RD a drain-source resistance, $C_{DS}$ a drain-source capacitance, $C_{GS}$ a gate-source capacitance, and $C_{Mi}$ the Miller-capacitance between the gate and the drain. Coupled to the gate electrode G and the source electrode S are undesired inductance components $L_G$ and $L_S$ of bonding wires connected to these electrodes. The drain electrode D is directly coupled to the transistor package PK without a bonding wire, as will be described later with reference to FIG. 5. Accordingly, the inductance component of the drain electrode is negligible.

Connected to the drain electrode D is a drain side coaxial line $CL_1$ with an effective length $l_\lambda = \lambda/4 - l_x$, where $l_x$ is a length which compensates for the length change due to coupling of the internal capacitances of the field effect transistor in terms of the wave length $\lambda$ at which the microwave circuit oscillates. The internal conductor of the coaxial line $CL_1$ has a diameter $d_1$, while an external conductor thereof has a diameter $d_2$. The characteristic impedance $Z_1$ of the coaxial line $CL_1$ is 60 ln $(d_2/d_1)$. The coaxial line is short-circuited at one end to form, as an equivalent circuit, a tank circuit having an inductance and a capacitance which are connected in parallel. The internal conductor of the coaxial line $CL_1$ is coupled to a load resistor $R_L$ and further to a measuring loop ML for directly interlinking the loop with the resonant cavity of the coaxial line $CL_1$ to measure the frequency and the current of the oscillating signal.

To the gate electrode G, a gate side coaxial line $CL_2$ is connected by way of the inductance component $L_G$ of the bonding wire. The coaxial line $CL_2$ with an effective length $\lambda/4 - l_y$, of which both ends are open, forms a series circuit consisting of an inductance and a capacitor. One end of the coaxial line $CL_2$ is connected to a trimmer capacitor $C_T$ which provides a resonant frequency adjustment. The inductance $L_G$, the series circuit of the inductance and the capacitor, and the trimmer capacitor $C_T$ form a series resonance circuit. The gate electrode G is grounded through the low resonance impedance, thereby eliminating the adverse effect of the inductance $L_G$. The diameter of the drain side coaxial line $CL_1$ is larger than that of the gate side coaxial line $CL_2$.

The source electrode S is connected to a source resistor $R_S$ in order to stabilize the source current. The source electrode S is connected through the resistor $R_S$, the source field inductance $L_{SF}$ and a feed-through $FT_S$ to a common potential terminal of the control circuit CTL. The gate electrode G is connected through a gate feed inductance $L_{GF}$ and a feed-through $F_{TG}$ to a terminal for supplying a gate voltage $V_G$ of the control circuit CTL. The feed inductance $L_{GF}$ and $L_{SF}$ form a low-pass filter. Those inductances may also be substituted by a low-pass filter with a further complicated arrangement. The terminals of the inductances $L_{GF}$ and $L_{SF}$ on the side of the feed-throughs $FT_G$ and $FT_S$ are coupled to each other by a resistor Rp which provides a path for discharging charges stored in the gate electrode. The resistor Rp prevents a high voltage caused by an electrostatic effect from penetrating through the gate electrode G into the transistor Tr. Supplied to the control circuit CTL are a voltage $V_{AC}$ of, for example, 100 V from a commercial power source and an output control signal $S_{CTL}$. A supply voltage $V_{SP}$ obtained from the control circuit CTL is supplied to a power feed case CS and the external conductors of the coaxial lines $CL_1$ and $CL_2$. The power supply case CS is set at the same potential as that at the common potential point connecting one end of each of the drain side and gate side coaxial resonating systems. The filter is connected in the power supply case CS.

Figure 2:
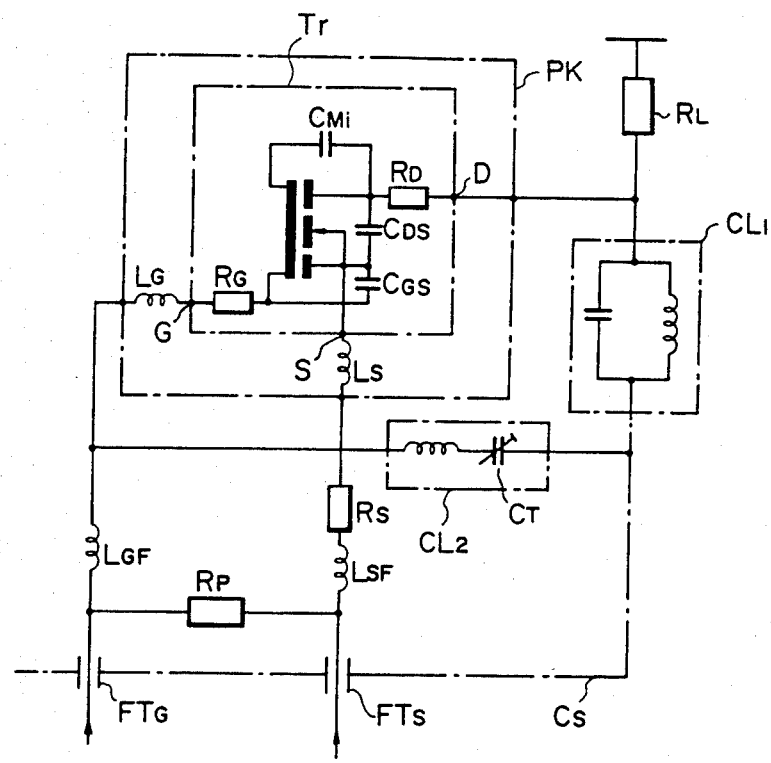
FIG. 2 is a circuit diagram showing an equivalent circuit of the essential part in FIG. 1.

The grounding connection of the source electrode S is made through the gate-source capacitor $C_{GS}$, the gate resistor $R_G$, and the tuned gate side coaxial line $CL_2$ serving as a low impedance element. The field effect transistor Tr shown in FIG. 1, together with the internal capacitances $C_{DS}$ and $C_{GS}$, form a Colpitts oscillator represented by the equivalent circuit shown in FIG. 2 and making use of the tank circuit represented by the coaxial line $CL_1$ and the capacitances $C_{DS}$ and $C_{GS}$ in the chip as well. The amount of positive feed-back required to produce oscillations upon the application of the gate voltage $V_G$ is determined by the ratio $C_{DS}/C_{GS}$ of the capacitances $C_{DS}$ and $C_{GS}$. Since the drain-gate capacitance $C_{Mi}$ adversely affects the oscillating frequency, it is desirable to set the capacitance $C_{Mi}$ as low as possible.

A practical example of a microwave power generating apparatus with such a construction will be given below. The characteristic impedance $Z_1$ of the coaxial line $CL_1$ is $Z_1 = 60 \ln(65/60) = 4.8 \, \Omega$ ($d_1 = 60$ mm, $d_2 = 65$ mm); $l_\lambda = 600$ mm; the oscillating frequency = 105 MHz; the coupling capacitance Ck of the tank circuit with the field effect transistor Tr is, $Ck \approx 80$ pF; $C_{DS} \approx 100$ pF; $C_{GS} \approx 1500$ pF; $C_{Mi} \approx 100$ pF; $L_G \approx 5$ to 10 nH; $L_S \approx 5$ to 20 nH; $D_G \approx 1$ to 10 $\Omega$; $D_S \approx 1$ to 5 $\Omega$. In order to attain an output power of 200 W, the load resistance $R_L$ must be about 50 $\Omega$, and the characteristic impedance $Z_1$ of the coaxial line $CL_1$ must be about 5 $\Omega$. Accordingly, 4.8 $\Omega$ of the characteristic impedance $Z_1$ satisfies such a requirement.

The compensating length $l_x$ is given by $$l_x = (\lambda/2\pi) \cdot \arctan(Z_1/X)$$

$$X = 1/\omega C - \omega L$$

$$C \approx (C_{DS} \cdot C_{GS})/(C_{DS} + C_{GS}) + C_{Mi}$$

$$L \approx L_G$$

$$\lambda = c/f$$

c: light velosity f: oscillating frequency

In a numerical example, $(z_1/x) < (0.15 \text{ to } 0.3)$; $(lx/\lambda)$ max $\approx 0.025$ to $0.05$; $lx = 0.1 \, l_\lambda$ to $0.2 \, l_\lambda$. The oscillating frequency f is given by $f = c/\lambda$, where c equals the velocity of light; when $\lambda/4 = 7.5$ cm, $f = 1000$ MHz and when $\lambda/4$ 8.2 cm, $f = 915$ MHz.

Figure 3:
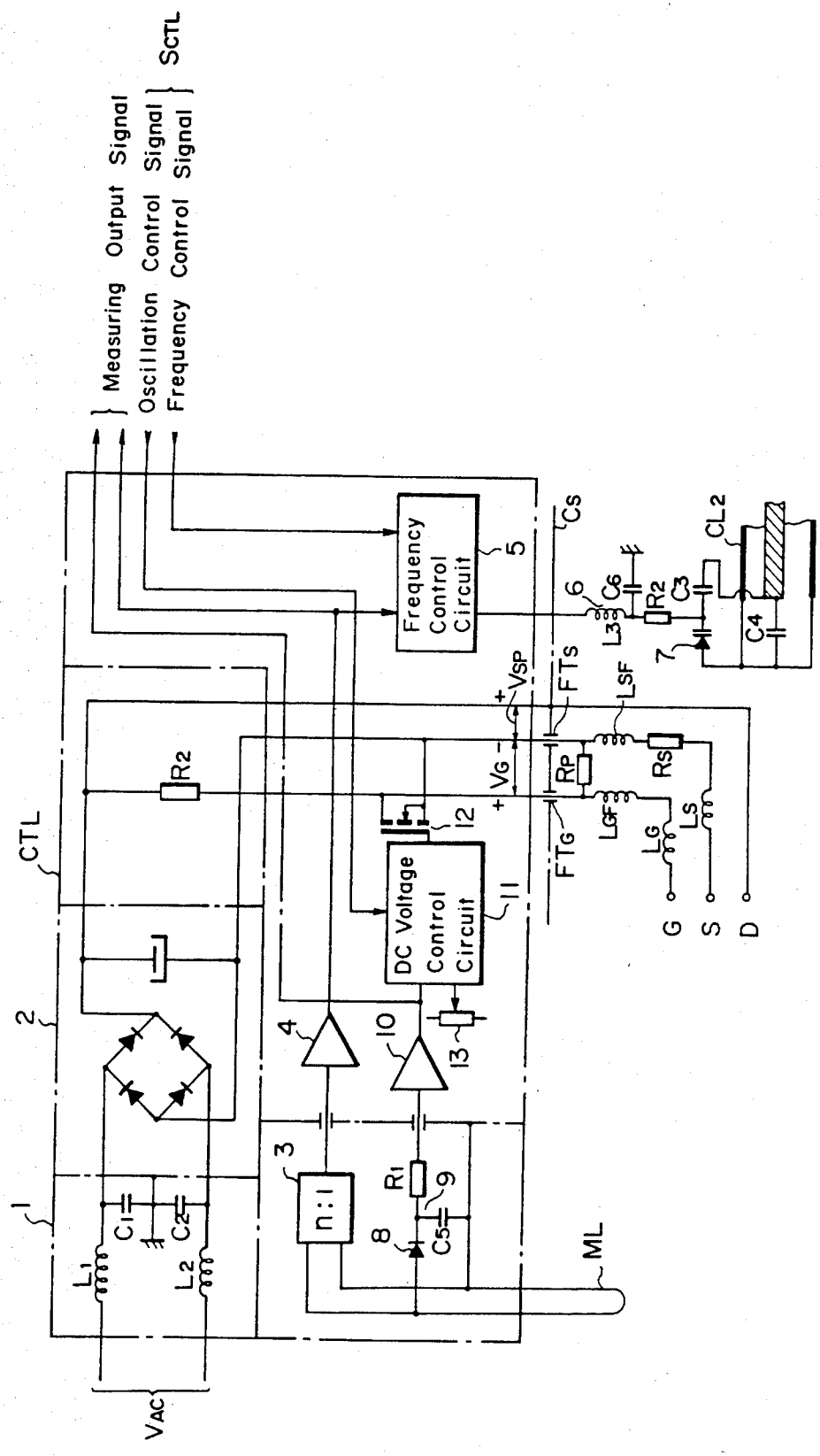
FIG. 3 is a circuit diagram showing an embodiment of the control circuit shown in FIG. 1.

An embodiment of the control circuit CTL shown in FIG. 1 is shown in FIG. 3. A commercial power source $V_{AC}$ is supplied to a rectifier/smoothing circuit 2 via a line filter 1 including line inductances $L_1$ and $L_2$ and capacitors $C_1$ and $C_2$. A supply voltage Vsp obtained from the rectifier/smoothing circuit 2 is applied between the source and the drain of the field transistor Tr. A signal from the measuring loop ML is frequency-divided into a factor of n by an n-frequency divider 3. The n-divided signal is supplied through a preamplifier 4 to a frequency control circuit 5 and provides an output for measuring the oscillating frequency. A frequency control signal is supplied from an external source to the frequency control circuit 5 to produce a frequency control voltage which is applied to a voltage dependent capacitance element, such as a varactor diode 7, through a filter 6. In the present embodiment, in place of the trimmer capacitor $C_T$ of FIG. 1, a parallel circuit including a capacitor $C_4$ and a series circuit consisting of the varactor diode 7 and a capacitor $C_3$ is connected between the inner and external conductors of the coaxial line $CL_2$ at the opening end of the same coaxial line. The oscillating frequency is controlled by slightly changing a terminal capacitance of the coaxial line in a manner such that the frequency control voltage supplied from the frequency control circuit 5 to the varactor diode 7 via a filter 6 including an inductance $L_3$, a capacitor $C_6$ and a resistor $R_2$ is varied to change the capacitance of the varactor diode 7. In this way, the oscillating frequency of 915 MHz can be changed by about $\pm 1.5\%$. Further, the oscillating frequency can also be adjusted by changing the voltage Vsp applied between the drain and the source of the transistor Tr.

The signal from the measuring loop ML is also supplied to a preamplifier 10, through a rectifier 8 and a smoothing circuit 9 including a resistor R1 and a capacitor C5, for example. The output signal from the amplifier is supplied to a DC voltage control circuit 11 and is also outputted from the control circuit to permit measuring the oscillating output. The supply voltage from the rectifier circuit 2 is supplied to the drain electrode of a power MOS field effect transistor 12 by way of a resistor $R_2$ and also to the gate electrode of the MOS type field effect transistor Tr through the gate feed-through $FT_G$ and the gate feed inductance $L_{GF}$. The source electrode of the MOS type field effect transistor 12 is connected to the source electrode of the MOS field effect transistor Tr, through the source feed-through $FT_S$ and the source feed inductance $L_{SF}$. The control output $V_G$ from the DC voltage control circuit 11 is supplied to the gate electrode of the MOS field effect transistor 12. The control output $V_G$ controls the drain-source voltage of the MOS field effect transistor 12. An oscillation control signal in the form of a PWM signal which may, for example, be generated externally is applied to the DC voltage control circuit 11. The oscillation control signal can be adjusted by a variable resistor R13. In the DC voltage control circuit 11, feedback control of the control output $V_G$ is performed in accordance with the output signal from the preamplifier 10, so that the control output $V_G$ having an amplitude always determined by the variable resistor 13 is applied to the field effect transistor 12, thereby controlling the power of the oscillation output.

Figure 4:
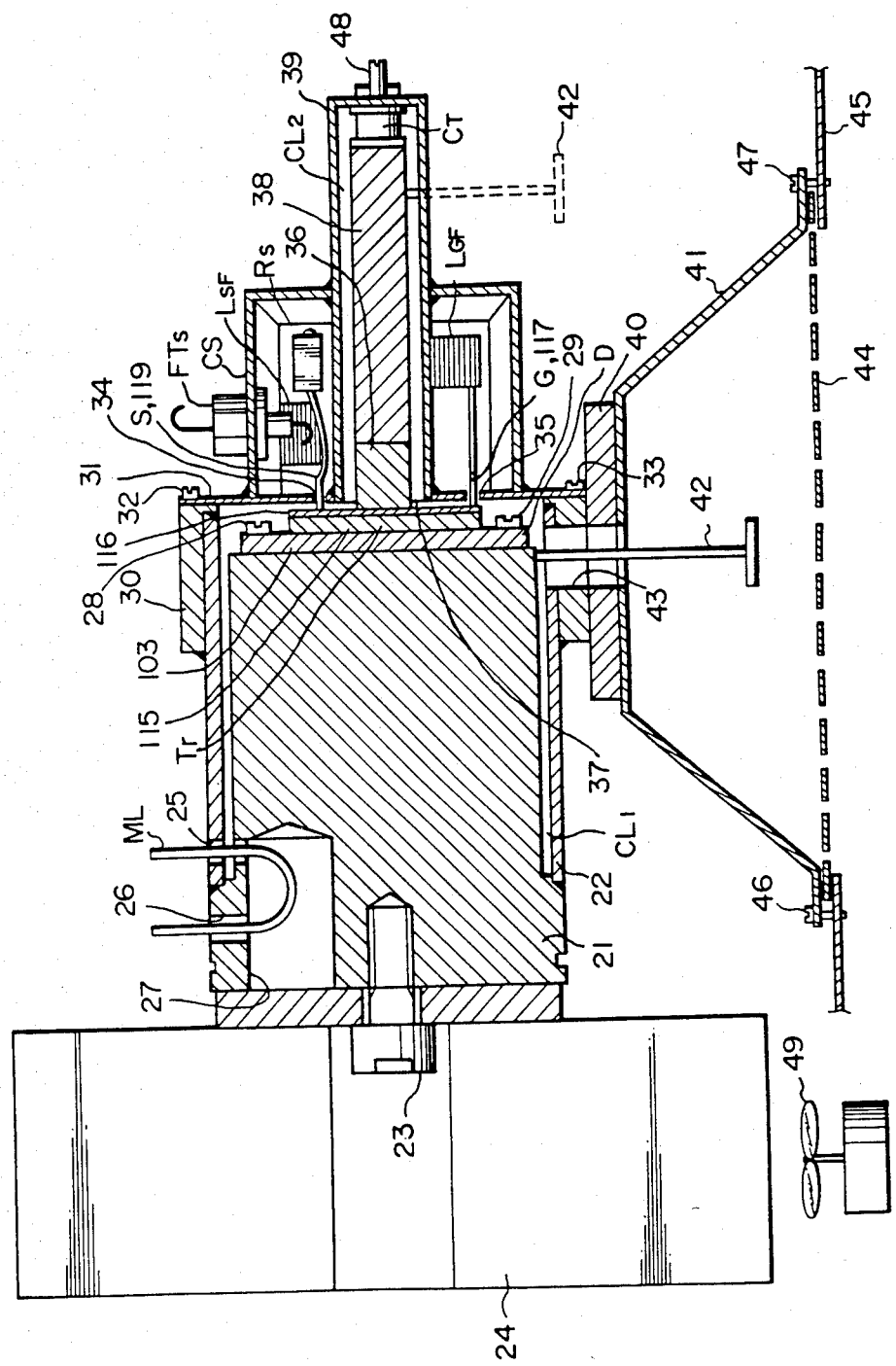
FIG. 4 is a sectional view showing an embodiment of a mechanical structure of a microwave power generating apparatus according to the present invention.

An embodiment of a mechanical arrangement of the microwave power generating apparatus according to the present invention shown in FIG. 1 is shown in FIG. 4. In FIG. 4, the same reference numerals are used to designate like portions in FIG. 1. An external conductor 22 is welded to an internal conductor 21 in the form of a solid cylinder and made of copper or aluminum, for example to form the coaxial line $CL_1$. A heat sink 24 with cooling radiating fins is fixed to the internal conductor 21 by means of a screw 23. The internal conductor 21 is further provided with through-holes 25 and 26 allowing the measuring loop ML to be inserted therethrough, and a cavity 27. The drain electrode D of the power MOS field effect transistor Tr is mounted to one end of the internal conductor 21 by means of screws 28 and 29. A tubular frame 30 is fitted around an external peripheral surface of one end of the external conductor 22. Then, a ring-like cover plate 31 is fixed to the frame 30 by means of screws 32 and 33. The cover plate 31 has holes 34 and 35 previously formed to allow the gate and source electrodes G and S of the transistor Tr to be extracted, and a through-hole 37 also previously formed to allow a conductor cylinder 36 to be passed therethrough to connect the gate electrode G to the coaxial line $CL_2$. The coaxial line $CL_2$ is comprised of an internal conductor 38 and an external conductor 39. The cylinder 36 is connected to the internal conductor 38, and the external conductor 39 is mounted to the inside of the through-hole 37.

With such an arrangement, the respective ends of the drain and gate side coaxial resonating systems are connected to and closedly coupled to each other by the frame 30 mounted to the external conductor 22 of the drain side coaxial resonating system and the cover plate 31 for coupling an end face of the frame 30 to the external conductor 39 of the gate side coaxial resonating system. As described above, the frame 30 and the cover plate 31 are removably coupled to each other by means of the screws 32 and 33, so that the gate side coaxial resonating system is separated from the drain side coaxial resonating system by breaking the coupling of the frame 30 with the cover plate 31.

As to the structure of the MOS field effect transistor Tr, FIG. 4 illustrates only the drain electrode D in the form of a copper plate 103, a ceramic ring 115, extracting pins 117 and 119 to be connected to the gate and source electrodes. The detailed structure of the transistor Tr will be illustrated in FIGS. 5 and 6.

A case CS is disposed between the cover plate 31 and the external conductor 39. The circuit components $L_{GF}$, $L_{SF}$, Rp and $R_s$ shown in FIG. 1 are disposed in the case CS, and the lead pins 117 and 119 are connected to the feed-throughs $FT_S$ and $FT_G$. A supporting member 41 in the form of a quadrangular pyramid is mounted on the frame 30 through a ceramic plate 40 as an insulating member. An antenna bar 42 for guiding the oscillating output is protruded from the internal conductor 21 of the coaxial line $CL_1$. A through-hole 43 is formed in the external conductor 22, the frame 30, the ceramic plate 40 and the top flat part of the supporting member 41 so as to allow the antenna bar 42 to pass therethrough.

Reference numeral 44 designates an isolation board made of glass fiber or synthetic resin. The supporting member 41 is fixed through the isolation board 44 to a grounded case 45 of an object to which the oscillating output is to be supplied, such as the oven cavity of an electronic oven, for example, by means of screws 46 and 47. Reference numeral 48 designates an adjusting screw for the trimmer capacitor $C_T$, and its detail will be illustrated in FIG. 8. The heat sink 24 may be forcibly air-cooled by a fan 49.

As seen from the above-mentioned structure, the drain and the gate side coaxial resonating systems form a single closed case for microwave energy. The internal conductors 21 and 38 of both coaxial resonating systems and the MOS FET Tr of which the drain and gate electrodes are respectively connected to the ends of the internal conductors 21 and 38, as will be described with reference to FIG. 5, are accommodated in the closed case.

Figure 5:
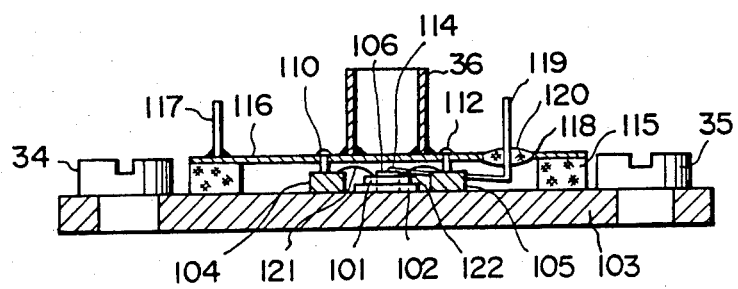
FIG. 5 is a sectional view showing an embodiment of a structure of the MOS field effect transistor used in the present invention.
Figure 6:
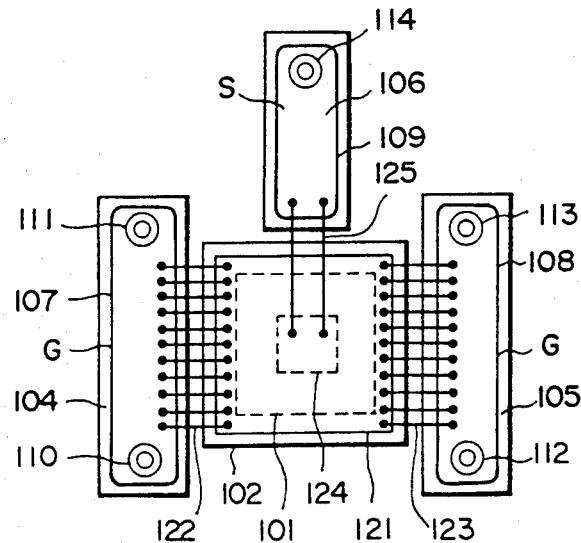
FIG. 6 is a plan view showing a detailed embodiment of the transistor chip portion of the transistor shown in FIG. 5.

In FIG. 5, reference numeral 101 designates the chip of the MOS field effect transistor Tr. One of the surfaces of the chip 101 is fixed on a molybdenum substrate 102 which is also mounted to a copper plate 103, so that the surface of the chip is electrically connected to the copper plate 103. Ports 104, 105 and 106 in the form of ceramic bars are disposed in the vicinity of the chip 101 on the copper plate 103. These ports are respectively coated with electrode layers 107, 108 and 109 plated by nickel over evaporated films of copper, thereby forming drain, source and gate electrodes. Conductor pins made of copper 110 to 114 are protruded on the ports 104, 105 and 106, respectively. The ceramic ring 115 is disposed on the copper plate 103 so as to enclose the ceramic bars 104 to 106. A gate conductive plate 116 such as a conductive member of copper or the like is hermetically fixed to the other open end of the ceramic ring 115. In this way, in the transistor of the present embodiment, the transistor chip 101 is housed in the transistor package PK (FIG. 1) hermetically enclosed by the ceramic ring 115 and the conductive plate 116. The conductive pins 110 to 113 planted in the gate ports 104 and 105 are fixed at their ends to the conductive plate 116. Further, the gate lead pin 117 and the gate electrode cylinder 36 are protruded on the upper surface of the gate conductive plate 116. A source electrode through-hole 118 is formed in the gate conductive plate 116 and a source lead pin 119 connected to the source conductive pin 114 is extracted from the gate conductive plate 116. Then, the pins are hermetically fixed to the hole 118 by an insulating member 120 made of ceramic or the like. As shown in FIG. 6, the gate region 121 of the chip 101 is connected to the gate electrode layers 107 and 108 by means of bonding wires 122 and 123 in a multiple bonding manner. The source region 124 of the chip 101 is connected to the source electrode layer 109 by means of bonding wires 125 in a multiple bonding manner. With the structure of the present embodiment, the gate inductance $L_G$ and the gate resistance $R_G$ can be reduced by using the cylinder 36 as the gate electrode.

Figure 7:
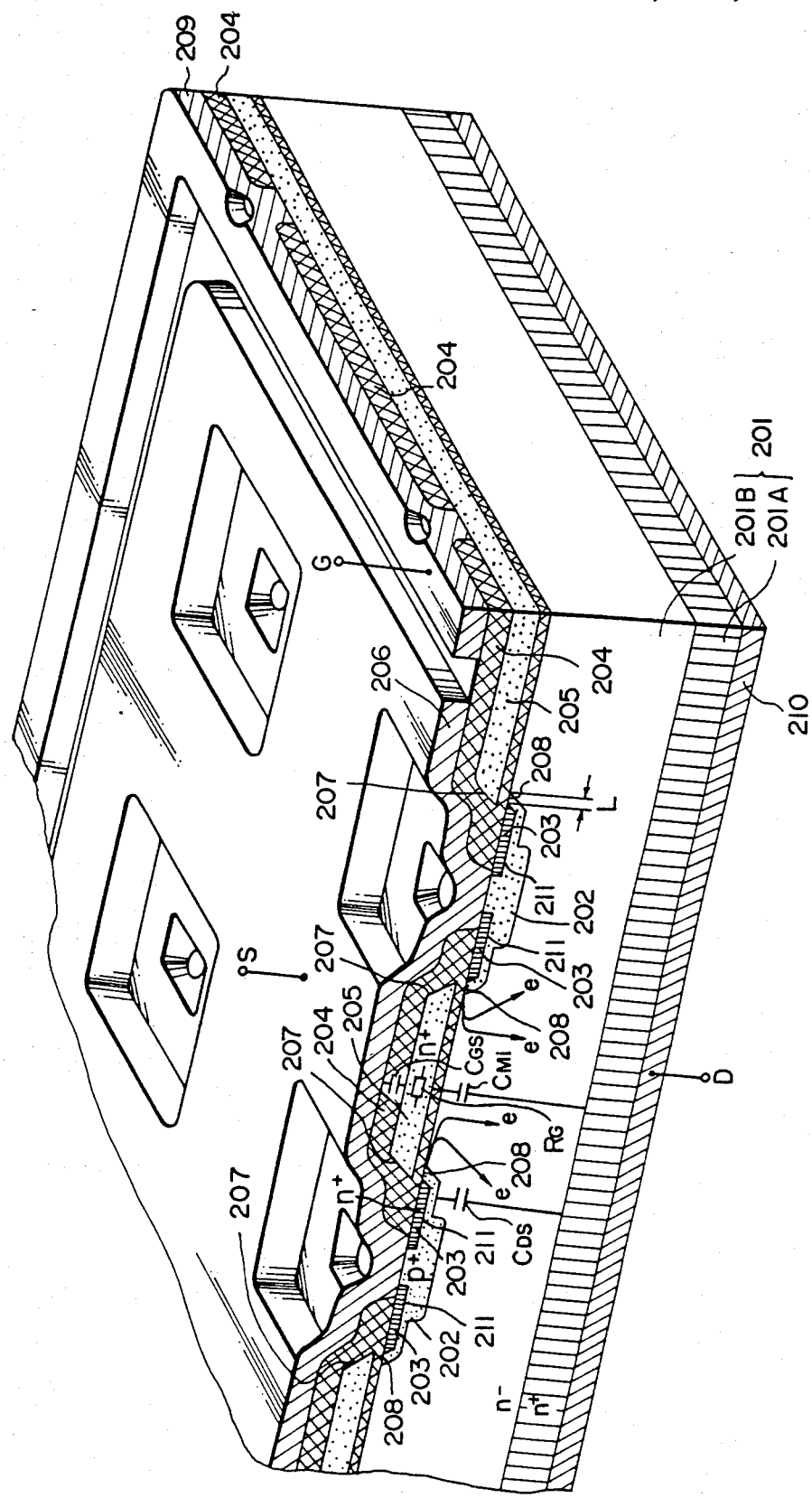
FIG. 7 is a perspective view showing an embodiment of a detailed structure of the transistor chip shown in FIG. 5.

An n-channel enhancement MOS field effect transistor as an example of the MOS FET chip of the high voltage withstand and large current type which is to be used in the present invention is illustrated in FIG. 7. In the figure, reference numeral 201 designates a substrate serving as a drain region including an $n^+$ region 201A and an $n^-$ region 201B disposed thereon. A number of $p^+$ type troughs 202 to be used as the second gates are disposed on the surface of the $n^-$ region 201B is an island fashion and island-like source regions 204 of n+ type are further disposed on the surfaces of the troughs 202, respectively. The surface of the n− region 201B between the island-like source regions 203 is covered with gate regions 205 made of n+ type polysilicon buried in an insulating silicon oxide film 204. Those island-like source regions 203 are interconnected by a source electrode 206 made of conductive material such as aluminum, copper or the like disposed in a manner to cover almost the entire surface of the chip except the peripheral portion of the chip. The gate region 205 has clearly delineated inclined surfaces 207 and the inclined surfaces 207 are used as a mask for implanting n- and p-ions during the fabricating processes of channel regions 208 having an extremely narrow width L (e.g. 1 μm or less). Reference numeral 209 is a gate electrode disposed around the outer peripheral portion of the chip to enclose the source electrode 206. The gate electrode 209 is connected to the gate region 205 through openings arranged in an island fashion. Reference numeral 210 designates a drain electrode which is coated over the lower surface of the n+ region 201A. The gate and drain electrodes 205 and 210 may also be made of a conductive material such as aluminum, copper or the like. As clear from the above, the transistor is fabricated as the vertical MOS type chip in which the drain electrode 210 is disposed on one of the surfaces of the chip, while the source electrode 206 and the gate electrode 205 are disposed on the other surface of the chip.

In the figure, S designates a lead wire from the source electrode 205, D a lead wire from the drain electrode 210, $C_{DS}$ the drain-source capacitance, $C_{Mi}$ the drain-gate capacitance, $C_{GS}$ the gate-source capacitance, and $R_G$ the gate resistor. In the field effect transistor, as shown by arrows, electrodes e after passing through the channel 208 travel between the source regions 203 disposed in an island fashion toward the drain electrode 210. A pn-junction 211 is formed between the source region 203 and the second gate region 202.

By forming the channel 208 with a narrow width by ion implantation and by properly disposing the source, gate and drain regions 206, 205 and 201, good characteristics such as good conductivity and preferable cutoff voltage are obtained. Further, the transistor is simple in structure, excellent in reproducibility of electrical characteristics, reliability, and durability against an instantaneous overload.

In the microwave power generating apparatus according to the present invention shown in FIG. 1, the gate-source capacitance $C_{GS}$ of the MOS type field effect transistor Tr is used to obtain oscillations in the microwave frequency range. For the formation of the gate-source capacitance $C_{GS}$, the silicon oxide film 204 as a dielectric medium is interposed between a matrix-like gate region 205 common to a number of transistor units, which are integrated in a single chip 101 (see FIGS. 5 and 6) forming the transistor Tr as shown in FIG. 7, and a metal film as the source electrode 206 which is coated over the silicon oxide film 204 so as to cover the entire gate region.

Figure 8:
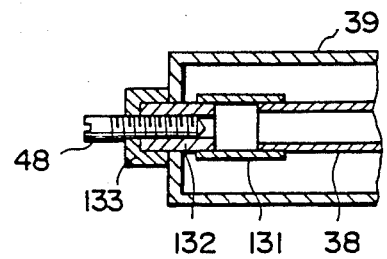
FIG. 8 is a sectional view showing an embodiment of the trimmer capacitor shown in FIG. 4.

FIG. 8 shows a detailed structure of an embodiment of the trimmer capacitor $C_T$ shown in FIG. 4. A conductive tube 131 is inserted at one end into the internal conductor 38 of the coaxial line CL2, while the tube 131 is inserted at the other end into a ceramic tube 132. The adjusting screw 48 is slidably fitted into the ceramic tube 132. The ceramic tube 132 is fixed to the external conductor 39 to project outwardly from the end thereof. A metal cover 133 is fixed to the end of the external conductor 39 to cover the ceramic tube 132. The metal cover 133 is provided with a screw groove allowing the adjusting screw 48 to slide along the ceramic tube 132. Through the adjustment of the adjusting screw 48, a distance between its screw end and the conductive tube 131 can be changed to adjust a value of the terminal capacitance of the coaxial line CL2.

Figure 9:
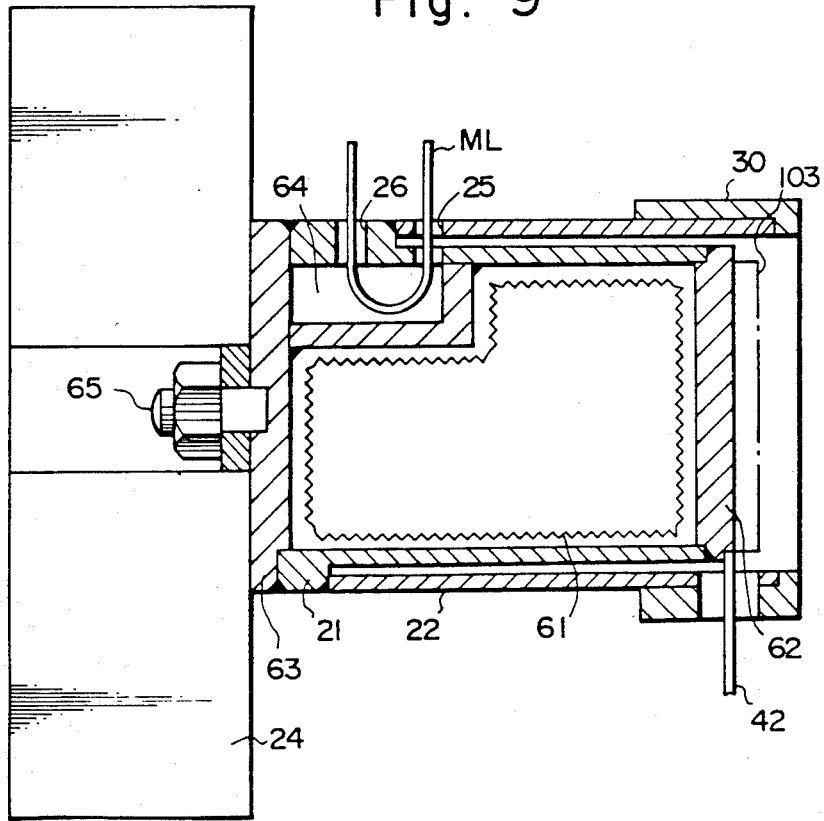
FIG. 9 is a sectional view showing a modified embodiment of a structure of a microwave power generating apparatus according to the present invention.

While the present invention has been described by way of specific embodiments, the invention may be variously modified or changed. For example, the solid internal conductor 21 (FIG. 4) of the drain side coaxial line CL1 may be replaced by a hollow cylindrical conductor, as shown in FIG. 9. In this case, a wick 61 of a hollow cylindrical heat pipe may be disposed in the hollow cylindrical conductor. In FIG. 9, the hollow cylindrical conductor 21 is sealed at both ends by discs 62 and 63 and has a cavity 64 for accommodating the measuring loop ML. The cooling heat sink 24 is fixed to the disc 63 by means of a screw 65.

The antenna 42 for obtaining the oscillating output may be coupled to the coaxial line CL2 instead of the coaxial line CL1. The coupling arrangement of the antenna 42 is indicated by a broken line in FIG. 4. The measuring loop ML may also be coupled to the coaxial line CL2. The effective length of each of the coaxial lines CL1 and CL2 is not limited to λ/4, but may be 3λ/4.

As seen from the foregoing description, according to the present invention, a high frequency oscillation from 100 to 1000 MHz may be realized with a simple construction in which the coaxial lines are coupled to the drain and gate electrodes of the transistor by utilizing the internal capacitances $C_{GS}$ and $C_{DS}$ of the power MOS field effect transistor. Particularly, the gate-source capacitor is formed by the silicon oxide layer between the polysilicon gate and the aluminum source. Accordingly, the capacitor thus formed has a low dielectric loss at a high frequency. Further, the gate electrode is coupled to the gate side coaxial line through the hollow cylindrical conductor, so that the resistance value of the gate resistor $R_G$ may also be minimized with little adverse effect on the oscillation. The gate inductance $L_G$ is compensated by the gate side coaxial line CL2 and the gate electrode is grounded at a high frequency.

According to the present invention, a magnetron is not employed and thus a microwave power generating apparatus of small size and light weight is manufactured. Additionally, both of the oscillating output and the oscillating frequency can be controlled by a simple measuring loop buried in a coaxial line. In this respect, a microwave power generating apparatus according to the present invention is more advantageous than the conventional apparatus in which only the oscillating output is changed by changing the power voltage in a pulse fashion by using a pulse power source of large size and heavy weight similar to that of the magnetron. In the case of a magnetron, it is difficult to perform frequency modulation. On the other hand, according to the present invention the oscillating frequency can easily be varied by merely changing the terminal capacity of the gate side coaxial line. Therefore, the present invention is very advantageous especially when it is applied for use in various microwave apparatuses using microwave power such as radars, microwave communication systems, electronic ovens, or the like.

What is claimed is:

1. A microwave power generating apparatus for generating oscillations at a predetermined microwave frequency, comprising:
- a power MOS field effect transistor having a gate electrode, a drain electrode and a source electrode, said transistor having drain-source and gate-source capacitances;
- a drain side coaxial resonating system having a cavity comprising an internal conductor connected to said drain electrode and an external conductor surrounding said internal conductor, said cavity forming a parallel resonant circuit tuned to said predetermined microwave frequency;
- a gate side coaxial resonating system having a cavity comprising an internal conductor connected to said gate electrode and an external conductor surrounding said internal conductor, said gate side coaxial resonating system further comprising a variable capacitor connected to said internal and external conductors, said cavity and said variable capacitor forming a series resonant circuit tuned to said predetermined microwave frequency;
- means for connecting one end of each of said outer conductors of said drain and gate side coaxial resonating systems to a common potential point;
- means for applying a DC power source voltage between said common potential point and said source electrode;
- means for applying an oscillating control voltage signal to said gate electrode; and
- means for generating oscillations with a positive feedback ratio substantially determined by the ratio of the drain-source capacitance to the gate-source capacitance of said transistor, whereby the power output of said microwave power generating apparatus is derived from the internal conductor of said drain or gate side coaxial resonating system.

2. A microwave power generating apparatus as claimed in claim 1, wherein said drain side coaxial resonating system comprises a coaxial line having an effective length equal to one of $\frac{1}{4}$ and $\frac{3}{4}$ wave length of said microwave frequency, said coaxial line being closed at one end thereof.

3. A microwave power generating apparatus as claimed in claim 1, wherein the gate-source capacitance of said MOS field effect transistor is formed with such a structure that a silicon oxide film such as a dielectric medium is interposed between a matrix gate common to a number of transistor units integrated in a single chip forming said transistor and a metal film as the source electrode deposited on said silicon oxide film covering said gate.

4. A microwave power generating apparatus as claimed in claim 1, wherein a measuring loop used as a detecting terminal for control of said microwave power generating apparatus is coupled to one of said drain and gate side coaxial resonating systems, said measuring loop being directly interlinked to a resonating cavity of one of said drain and gate side coaxial resonating system.

5. A microwave power generating apparatus as claimed in claim 4, in which said variable capacitor of said gate side coaxial resonating system is a variable capacitor in the form of a voltage dependent capacitive element, so that said oscillating frequency is controlled by controlling the voltage applied to said voltage dependent capacitive element in response to a detected signal from said measuring loop as an actual value signal.

6. A microwave power generating apparatus as claimed in claim 1, wherein said variable capacitor of said gate side coaxial resonating system is a trimmer capacitor and said oscillating frequency is controllable by adjusting said trimmer capacitor.

7. A microwave power generating apparatus as claimed in claim 1, wherein said power output is controlled by pulse-width-modulating said oscillation control voltage signal applied to said gate electrode.

8. A microwave power generating apparatus as claimed in claim 4 or 7, wherein said oscillating control voltage signal applied to said gate electrode is pulse-width-modulated by comparing the detected signal from said measuring loop as an actual signal so that said power output is controlled to a predetermined value.

9. A microwave power generating apparatus as claimed in claim 1, wherein a chip of said MOS field effect transistor is thermally closely mounted to a plate-like conductive substrate, to which one end of said internal conductor in the form of a solid cylinder of said drain side coaxial resonating system is thermally closely coupled, and a cooling heat sink is mounted to the other end of said internal conductor.

10. A microwave power generating apparatus as claimed in claim 1, wherein a chip of said MOS field effect transistor is thermally closely mounted to a conductive substrate, to which one end of said internal conductor of said drain side coaxial resonating system acting as a heat pipe in the form of a hollow cylinder is thermally closely coupled, and a cooling heat sink is mounted to the other end of said internal conductor.

11. A microwave power generating apparatus as claimed in claim 1, wherein said MOS field effect transistor is formed as a vertical MOS type chip in which the drain electrode is formed on one of the surfaces of said chip and the source electrode and the gate electrode are disposed on the other surface, said one surface of said chip is mounted on and electrically connected to said conductive substrate, a ceramic ring is disposed around said chip thus mounted, one end surface of said ceramic ring is hermetically mounted to said conductive substrate, an opening of the other end face of said ceramic ring is hermetically closed by a gate conductive plate, so that said conductive substrate, said ceramic ring and said gate conductive plate form a sealing case for accommodating said chip, the gate electrode of said chip is connected to said gate conductive plate, and a source electrode pin in the form of a sealing terminal passing through said sealing case is derived from said source electrode.

12. A microwave power generating apparatus as claimed in claim 11, wherein said gate electrode of said MOS field effect transistor chip is disposed on the peripheral portion of the other surface of said chip, said gate electrode is connected to conductive gate electrode layers on a gate port made of insulating material and mounted to said conductive substrate by means of a plurality of bonding wires, and said conductive gate electrode layers are further connected to said gate conductive plate through conductive pins planted on said conductive gate electrode layers.

13. A microwave power generating apparatus as claimed in claim 1 or 11, wherein said drain and gate side coaxial resonating systems are electrically and mechanically connected at said one ends of said external conductors thereof and form a closed case with respect to energy oscillating at said microwave frequency, and said internal conductors of both said coaxial resonating systems are accommodated in said closed case, together with said MOS field effect transistor of which said drain and gate electrodes are connected to said one ends of said internal conductors.

14. A microwave power generating apparatus as claimed in claim 1, wherein a source resistor is connected in series with a power feeding line connected to said source electrode to stabilize the current flowing through said power feeding line.

15. A microwave power generating apparatus as claimed in claim 1, wherein a resistor for discharging charges from said gate electrode is connected between a power feeding line connected to said gate electrode and said power feeding line connected to said source electrode.

16. A microwave power generating aparatus as claimed in claim 1, wherein microwave frequency filters are arranged with respect to said power feeding lines to said gate and source electrodes in a manner such that the potentials at said filters are set at the same potential as that at a common potential point connecting said one ends of said drain and gate coaxial resonating systems to each other, and said filters are disposed in a power feeding case closed with respect to energy oscillating at said microwave frequency.

17. A microwave power generating apparatus as claimed in claim 16, wherein each of said filters includes feed inductances inserted into said power feeding lines connected to said gate and source electrodes and a capacitance associated with feed-throughs via which said power feeding lines pass through said power feeding case.

18. A microwave power generating apparatus as claimed in claim 1, wherein the diameter of said drain side coaxial resonating system is larger than that of said gate side coaxial resonating system, said one ends of both said coaxial resonating systems are connected and closely coupled to each other by means of a tubular frame mounted to said external conductor of said drain side coaxial resonating system and a ring-like cover plate for coupling an end face of said frame to said external conductor of said gate side coaxial resonating system, whereby a power output is derived from said internal conductor of said drain side coaxial resonating system through a through-hole of said frame by an antenna bar.

19. A microwave power generating apparatus as claimed in claim 18, wherein said frame is removably coupled to said cover plate and said gate side coaxial resonating system is separated from said drain side coaxial resonating system by breaking the coupling of said frame with said cover plate.

20. A microwave power generating apparatus as claimed in claim 18, wherein said frame is mounted through an insulating member to a grounded case of an object to which said power output is to be supplied.

* * * * *